United States Patent
Wu et al.

(10) Patent No.: US 9,847,869 B1
(45) Date of Patent: Dec. 19, 2017

(54) FREQUENCY SYNTHESIZER WITH MICROCODE CONTROL

(71) Applicant: Integrated Device Technology, Inc., San Jose, CA (US)

(72) Inventors: Chung-Yu Wu, New Taipei (TW); Wei-Ching Chan, Taipei (TW); John Hsu, Sunnyvale, CA (US); Cheng Wen Hsiao, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 15/210,204

(22) Filed: Jul. 14, 2016

Related U.S. Application Data (60) Provisional application No. 62/245,799, filed on Oct. 23, 2015.

(51) Int. Cl.
*H03D 3/24* (2006.01)
*H04L 7/033* (2006.01)
*H04L 12/70* (2013.01)

(52) U.S. Cl.
CPC ...... *H04L 7/033* (2013.01); *H04L 2012/5681* (2013.01)

(58) Field of Classification Search
CPC .................. H04L 7/033; H04L 2012/5681
USPC .......................................................... 375/327
See application file for complete search history.

(56) References Cited

U.S. PATENT DOCUMENTS

| | | | |
|---|---|---|---|
| 4,684,941 A * | 8/1987 | Smith | H04W 88/02 340/9.1 |
| 4,862,485 A | 8/1989 | Guinea et al. | |
| 5,388,060 A | 2/1995 | Adams et al. | |
| 5,663,105 A | 9/1997 | Sua et al. | |
| 5,748,949 A | 5/1998 | Johnston et al. | |
| 5,757,240 A | 5/1998 | Boerstler et al. | |
| 5,848,355 A * | 12/1998 | Rasor | H04B 1/30 331/176 |
| 5,903,195 A | 5/1999 | Lukes et al. | |
| 6,219,797 B1 | 4/2001 | Liu et al. | |
| 6,259,327 B1 | 7/2001 | Balistreri et al. | |
| 6,640,311 B1 | 10/2003 | Knowles | |
| 6,643,787 B1 | 11/2003 | Zerbe et al. | |
| 6,650,193 B2 | 11/2003 | Endo et al. | |
| 6,683,506 B2 | 1/2004 | Ye et al. | |

(Continued)

OTHER PUBLICATIONS

Silicon Laboratories, "19-Output PCIE GEN 3 Buffer", Si53019-A01A, Silicon Laboratories Inc., Rev. 1.1 May 2015, 34 Pages, Austin, TX.

(Continued)

*Primary Examiner* — Helene Tayong
(74) *Attorney, Agent, or Firm* — Glass & Associates; Kenneth Glass (57) ABSTRACT

A frequency synthesizer with microcode control that allows one or more programmable circuits of a frequency synthesizer system to be programmed using a plurality of microcode instructions. A method includes, setting a frequency synthesizer system to operate in a microcode mode, programming the frequency synthesizer system for microcode execution of a plurality of microcode instructions and executing the plurality of microcode instructions at the frequency synthesizer system to control one or more behaviors of one or more programmable circuits of the frequency synthesizer system.

13 Claims, 4 Drawing Sheets

(56) References Cited

U.S. PATENT DOCUMENTS

| | | | |
|---|---|---|---|
| 6,727,767 B2 | 4/2004 | Takada | |
| 6,768,387 B1 | 7/2004 | Masuda et al. | |
| 6,870,411 B2 | 3/2005 | Shibahara et al. | |
| 6,959,066 B2 | 10/2005 | Wang et al. | |
| 7,012,476 B2 | 3/2006 | Ogiso | |
| 7,323,916 B1 | 1/2008 | Sidiropoulos et al. | |
| 7,405,594 B1 | 7/2008 | Xu | |
| 7,434,083 B1 | 10/2008 | Wilson | |
| 7,541,848 B1 | 6/2009 | Masuda | |
| 7,545,188 B1 | 6/2009 | Xu et al. | |
| 7,573,303 B1 | 8/2009 | Chi et al. | |
| 7,586,347 B1 | 9/2009 | Ren et al. | |
| 7,590,163 B1 | 9/2009 | Miller et al. | |
| 7,671,635 B2 | 3/2010 | Fan et al. | |
| 7,714,565 B2 | 5/2010 | Abuhamdeh et al. | |
| 7,737,739 B1 | 6/2010 | Bi | |
| 7,741,981 B1 | 6/2010 | Wan et al. | |
| 7,750,618 B1 | 7/2010 | Fang et al. | |
| 7,756,197 B1 | 7/2010 | Ferguson et al. | |
| 7,786,763 B1 | 8/2010 | Bal et al. | |
| 7,800,422 B2* | 9/2010 | Lee | H03L 7/07 327/149 |
| 7,816,959 B1 | 10/2010 | Isik | |
| 7,882,404 B2 | 2/2011 | Dai et al. | |
| 7,907,625 B1 | 3/2011 | MacAdam | |
| 7,928,880 B2 | 4/2011 | Tsukamoto | |
| 7,941,723 B1 | 5/2011 | Lien et al. | |
| 8,010,072 B1* | 8/2011 | Nathawad | H03L 7/102 331/18 |
| 8,018,289 B1 | 9/2011 | Hu et al. | |
| 8,164,367 B1 | 4/2012 | Bal et al. | |
| 8,179,952 B2 | 5/2012 | Thurston et al. | |
| 8,188,796 B2 | 5/2012 | Zhu et al. | |
| 8,259,888 B2 | 9/2012 | Hua et al. | |
| 8,284,816 B1 | 10/2012 | Clementi | |
| 8,305,154 B1 | 11/2012 | Kubena et al. | |
| 8,416,107 B1 | 4/2013 | Wan et al. | |
| 8,432,231 B2 | 4/2013 | Nelson et al. | |
| 8,436,677 B2 | 5/2013 | Kull et al. | |
| 8,456,155 B2 | 6/2013 | Tamura et al. | |
| 8,471,751 B2 | 6/2013 | Wang | |
| 8,537,952 B1 | 9/2013 | Arora | |
| 8,693,557 B1 | 4/2014 | Zhang et al. | |
| 8,704,564 B2 | 4/2014 | Hasegawa et al. | |
| 8,723,573 B1 | 5/2014 | Wang et al. | |
| 8,791,763 B2 | 7/2014 | Taghivand | |
| 8,896,476 B2 | 11/2014 | Harpe | |
| 8,933,830 B1 | 1/2015 | Jeon | |
| 8,981,858 B1 | 3/2015 | Grivna et al. | |
| 9,077,386 B1 | 7/2015 | Holden et al. | |
| 9,100,232 B1 | 8/2015 | Hormati et al. | |
| 9,112,517 B1 | 8/2015 | Lye et al. | |
| 9,455,854 B2 | 9/2016 | Gao | |
| 2002/0079937 A1 | 6/2002 | Xanthopoulos | |
| 2002/0191727 A1 | 12/2002 | Staszewski et al. | |
| 2003/0042985 A1 | 3/2003 | Shibahara et al. | |
| 2003/0184350 A1 | 10/2003 | Wang et al. | |
| 2004/0136440 A1 | 7/2004 | Miyata et al. | |
| 2004/0165691 A1 | 8/2004 | Rana | |
| 2005/0170787 A1* | 8/2005 | Yamamoto | A63H 19/24 455/70 |
| 2006/0103436 A1 | 5/2006 | Saitou et al. | |
| 2006/0119402 A1 | 6/2006 | Thomsen et al. | |
| 2006/0197614 A1 | 9/2006 | Roubadia et al. | |
| 2006/0229018 A1 | 10/2006 | Mlinarsky et al. | |
| 2006/0290391 A1 | 12/2006 | Leung et al. | |
| 2007/0149144 A1 | 6/2007 | Beyer et al. | |
| 2007/0247248 A1 | 10/2007 | Kobayashi et al. | |
| 2008/0043893 A1 | 2/2008 | Nagaraj et al. | |
| 2008/0104435 A1 | 5/2008 | Pernia et al. | |
| 2008/0129351 A1 | 6/2008 | Chawla | |
| 2008/0246546 A1 | 10/2008 | Ha et al. | |
| 2009/0083567 A1 | 3/2009 | Kim et al. | |
| 2009/0128242 A1 | 5/2009 | Fitzgibbon et al. | |
| 2009/0140896 A1 | 6/2009 | Adduci et al. | |
| 2009/0153252 A1 | 6/2009 | Chen et al. | |
| 2009/0184857 A1 | 7/2009 | Furuta et al. | |
| 2009/0231901 A1 | 9/2009 | Kim | |
| 2009/0256601 A1 | 10/2009 | Zhang et al. | |
| 2009/0262567 A1 | 10/2009 | Shin et al. | |
| 2010/0007427 A1 | 1/2010 | Tomita et al. | |
| 2010/0052798 A1 | 3/2010 | Hirai | |
| 2010/0090731 A1 | 4/2010 | Casagrande | |
| 2010/0109714 A1* | 5/2010 | Lindfors | G06F 1/022 327/105 |
| 2010/0164761 A1 | 7/2010 | Wan et al. | |
| 2010/0194483 A1 | 8/2010 | Storaska et al. | |
| 2010/0240323 A1 | 9/2010 | Qiao et al. | |
| 2010/0323643 A1 | 12/2010 | Ridgers | |
| 2011/0006936 A1 | 1/2011 | Lin et al. | |
| 2011/0032013 A1 | 2/2011 | Nelson et al. | |
| 2011/0095784 A1 | 4/2011 | Behel et al. | |
| 2011/0234204 A1 | 9/2011 | Tamura et al. | |
| 2011/0234433 A1 | 9/2011 | Aruga et al. | |
| 2011/0264435 A1 | 10/2011 | Jamnejad et al. | |
| 2011/0285575 A1 | 11/2011 | Landez et al. | |
| 2011/0304490 A1 | 12/2011 | Janakiraman | |
| 2012/0013406 A1 | 1/2012 | Zhu et al. | |
| 2012/0043999 A1 | 2/2012 | Quevy et al. | |
| 2012/0161829 A1 | 6/2012 | Fernald | |
| 2012/0200330 A1 | 8/2012 | Kawagoe et al. | |
| 2012/0249207 A1 | 10/2012 | Natsume et al. | |
| 2012/0262315 A1 | 10/2012 | Kapusta et al. | |
| 2012/0293221 A1 | 11/2012 | Ma et al. | |
| 2012/0297231 A1 | 11/2012 | Qawami et al. | |
| 2012/0317365 A1 | 12/2012 | Elhamias | |
| 2012/0328052 A1 | 12/2012 | Etemadi et al. | |
| 2013/0002467 A1 | 1/2013 | Wang | |
| 2013/0162454 A1 | 6/2013 | Lin | |
| 2013/0194115 A1 | 8/2013 | Wu et al. | |
| 2013/0211758 A1 | 8/2013 | Prathapan et al. | |
| 2013/0300455 A1 | 11/2013 | Thirugnanam et al. | |
| 2014/0021990 A1 | 1/2014 | Na et al. | |
| 2014/0029646 A1 | 1/2014 | Foxcroft et al. | |
| 2014/0210532 A1 | 7/2014 | Jenkins | |
| 2014/0327478 A1 | 11/2014 | Horng et al. | |
| 2014/0347941 A1 | 11/2014 | Jose et al. | |
| 2015/0028960 A1* | 1/2015 | Yorita | H03L 1/026 331/176 |
| 2015/0162921 A1 | 6/2015 | Chen et al. | |
| 2015/0180594 A1 | 6/2015 | Chakraborty et al. | |
| 2015/0200649 A1 | 7/2015 | Trager et al. | |
| 2015/0213873 A1 | 7/2015 | Joo et al. | |
| 2016/0013796 A1 | 1/2016 | Choi | |
| 2016/0084895 A1 | 3/2016 | Imhof | |
| 2016/0119118 A1 | 4/2016 | Shokrollahi | |
| 2016/0162426 A1 | 6/2016 | Benjamin et al. | |
| 2016/0211929 A1 | 7/2016 | Holden et al. | |

OTHER PUBLICATIONS

ON Semiconductor, "NB3W1200L, NB31200L: 3.3 V 100/133 MHz Differential 1:12 Push-Pull Clock ZDB/Fanout Buffer for PCIe", ON Semiconductor, http://onsemi.com, Aug. 2013, Rev. 0, 26 Pages, Denver, CO.

Texas Instruments, "CDCEx913 Programmable 1-PLL VCXO Clock Synthesizer With 1.8-V, 2.5-V, and 3.3-V Outputs", Apr. 2015, pp. 1-36, pp. 11, 20-22, SCAS849F, Dallas, TX.

Avramov, et al., "1.5-GHz Voltage Controlled Oscillator with 3% Tuning Bandwidth Using a Two-Pole DSBAR Filter", Ultrasonics, Ferroelectrics and Frequency Control. IEEE Transactions on. vol. 58., May 2011, pp. 916-923.

Hwang, et al., "A Digitally Controlled Phase-Locked Loop with a Digital Phase-Frequency Detector for Fast Acquisition", IEEE Journal of Solid State Circuits, vol. 36, No. 10, Oct. 2001, pp. 1574-1581.

Kratyuk, et al., "Frequency Detector for Fast Frequency Lock of Digital PLLs", Electronic Letters, vol. 43, No. 1, Jan. 4, 2007, pp. 1-2.

Mansuri et al., "Fast Frequency Acquisition Phase-Frequency Detectors for GSamples/s Phase-Locked Loops", IEEE Journal of Solid-State Circuits, vol. 37 No. 10, Oct. 2002, pp. 1331-1334.

(56) References Cited

OTHER PUBLICATIONS

Nagaraju et aL, "A Low Noise 1.5GHz VCO with a 3.75% Tuning Range Using Coupled FBAR's", IEEE International Ultrasonics Symposium (IUS), Oct. 2012, pp. 1-4.
Watanabe et al., "An All-Digital PLL for Frequency Multilication by 4 to 1022 with Seven-Cycle Lock Time", IEEE Journal of Solid-State Circuits, vol. 39 No. 2, Feb. 2003, pp. 198-204.

* cited by examiner

FREQUENCY SYNTHESIZER WITH MICROCODE CONTROL

BACKGROUND OF THE INVENTION

Programmable timing devices, such as frequency synthesizers, must have a basic set of configuration parameters at each power-on of the timing device in order to generate the required timing device output signals for a processor board. Typically, at a power-on of the processor board, typically referred to as a "power-on-reset", the frequency synthesizer receives a configuration from the processor board through a logical interface of the programmable timing device, such as an Inter-Integrated ($I^2C$) interface or a system management bus (SMB) interface. The configuration for the frequency synthesizer may alternatively be received from a nonvolatile memory device such as a Read Only Memory (ROM). During the power-up of the processor board, the configuration for the frequency synthesizer is loaded into the phase locked loop (PLL circuit of the frequency synthesizer and is used to control the behavior of the frequency synthesizer, including setting one or more frequencies of the output signals of the PLL circuit.

Changing the default values of PLL circuit effects the behavior of the frequency synthesizer. Typically, the default values are modified or programmed through the logical interface of the frequency synthesizer. However, when the processor board and the frequency synthesizer are being initialized, the processor is unable to modify the configuration to effect the associated behavior of the PLL circuit until the initialization of the processor board and the frequency synthesizer is complete, and the logical interface is accessible. There are times when it is advantageous to be able to modify the behavior of the frequency synthesizer from the default setting as part of the board re-initialization or to modify the behavior of the frequency synthesizer without utilizing the logical interface.

Accordingly, what is needed in the art is a system and method for modifying the behavior of a frequency synthesizer that does not rely on a logical interface to provide the modified default values for configuring the frequency synthesizer.

SUMMARY OF THE INVENTION

The present invention allows one or more programmable circuits of a frequency synthesizer system to be programmed using a plurality of microcode instructions. In one embodiment, the behavior of a programmable timing device, such as a phase locked loop (PLL) circuit, is controlled through the execution of the microcode instructions.

In a particular embodiment, the microcode instructions are executed during the initialization of a processor board associated with the frequency synthesizer system so that the desired behavior of one or more programmable circuits of the frequency synthesizer system can be programmed during the initialization of the processor board. In an additional embodiment, the microcode instructions are executed during the normal operation of the frequency synthesizer system, following the initialization of the processor board.

In a specific embodiment, the microcode instructions are executed to program a programmable timing device of the frequency synthesizer system to operate a processor of the processor board in an overclocking mode.

In a particular embodiment, a method for controlling the behavior of a frequency synthesizer system is provided, including, setting a frequency synthesizer system to operate in a microcode mode, programming the frequency synthesizer system for microcode execution of a plurality of microcode instructions and executing the plurality of microcode instructions at the frequency synthesizer system to control one or more behaviors of one or more programmable circuits of the frequency synthesizer system.

In a particular embodiment, the frequency synthesizer system comprises a phase locked loop (PLL) circuit and executing microcode at the frequency synthesizer system controls one or more behaviors of the PLL circuit. The frequency synthesizer system may further include an output buffer circuit coupled to receive the output signals from the PLL circuit. In this embodiment, the execution of the microcode may further control one or more behaviors of the output buffer circuit.

In an additional embodiment, a frequency synthesizer system is provided, including, one or more programmable circuits, a logical interface to receive a microcode mode control signal, a data memory module coupled to the logical interface and to the one or more programmable circuits, the data memory module storing a plurality of microcode instructions to control one or more behaviors of the one or more programmable circuits. The frequency synthesizer system further includes, a control memory module coupled to the logical interface and the data memory module, the control memory module storing a sequence of addresses for the plurality of microcode instructions stored in the data memory module and a program counter coupled to the control memory module and the logical interface, the program counter for stepping through the sequence of addresses stored in the control memory module to execute the plurality of microcode instructions stored in the data memory module for controlling the one or more behaviors of the one or more programmable circuits of the frequency synthesizer system.

In a particular embodiment, the programmable circuit is a phase locked loop (PLL) circuit comprising a reference counter circuit, a loop filter circuit, a feedback counter circuit and an output divider circuit. In this embodiment the data memory module is coupled to one or more of the reference counter circuit, the loop filter circuit, the feedback counter circuit and the output divider circuit to control the behavior of the PLL circuit.

The present invention provides a system and method for modifying the behavior of a frequency synthesizer system utilizing a plurality of microcode instructions executed at the frequency synthesizer system for configuring one or more programmable circuits of the frequency synthesizer.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION OF THE INVENTION

In the present invention, a plurality of microcode instructions are stored in the memory of a frequency synthesizer system and the microcode instructions are executed to modify the behavior of the circuitry of the frequency synthesizer system.

It is commonly known in the art that, during re-initialization or start-up of a processor board comprising a frequency synthesizer system, the output frequencies and other characteristics of the frequency synthesizer may be controlled through a logical interface, such as Inter-Integrated Circuit ($I^2C$) interface or a System Management Bus (SMB). In the prior art, values stored in a system memory, such as Random Access Memory (RAM), are communicated through the logical interface to program the frequency synthesizer, thereby controlling the behavior of the frequency synthesizer. The logical interface is commonly implemented as a master-slave system, wherein the master issues a memory instruction, which is communicated to the slave and the slave responds by accessing the memory and performing the operation to program the frequency synthesizer. In normal initialization of the frequency synthesizer system, the memory instructions, represented by logical values, are written into the master through the logical interface and are then latched into the slave, in one continuous operation. As such, during normal initialization of the frequency synthesizer system, the master and the slave contain the same logical values in each memory location.

During initialization of a processor board comprising a frequency synthesizer system, the one or more circuits of the frequency synthesizer system are the first to initialize, thereby providing the timing control for the other circuits and the processor to initialize. However, during initialization of the frequency synthesizer system, the logical interface is not yet operational and the as such, the frequency synthesizer system does not receive an input from the $I^2C$ interface or a SMB interface to set the output frequencies of the programmable device, or otherwise control the behavior of the device, until the initialization of the processor board is complete and the logical interface is operational. As such, the behavior of the frequency synthesizer cannot be controlled by the $I^2C$ interface or a SMB interface until the initialization of the processor board is complete. Such a configuration does not allow the frequency synthesizer system to change its behavior during initialization to provide for a more sophisticated board initialization sequence.

In addition, is some cases, it is desirable to provide an output frequency from the frequency synthesizer system that is effective in overclocking a digital circuit that is coupled to an output of the frequency synthesizer system. Overclocking is a term that is commonly used to refer to the process of resetting a processor-based system so that the digital circuit runs faster than the speed specified by the manufacturer. For example, a processor that is rated to have a speed of 166 MHz may actually be capable of running in an overclocking mode of 200 MHz. Overclocking is frequently accomplished by resetting the system clock speed to a slightly higher level utilizing the frequencies generated by the frequency synthesizer system. Typically, the processor is overclocked by programming the frequency synthesizer system through an $I^2C$ interface after the initialization of the processor board has been completed. However, relying on the logical interface to program the frequency synthesizer to operate in an overclocking mode does not allow the frequency synthesizer system to go through multiple states when the processor board and frequency synthesizer are initialized. It is often desirable to be able to modify the behavior to place the frequency synthesizer in a overclocking mode during the initialization processor of the processor board.

In the present invention, the frequency synthesizer system is programmed to operate in a microcode mode, wherein a set of logical values are stored into memory locations of the master stage, and the logical values are modified during board initialization during execution of the microcode instructions, without being latched into the slave stage. The modified logical values are then sequentially latched into the slave stage and used to control the behavior of one or more circuits of the frequency synthesizer system.

Figure 1:
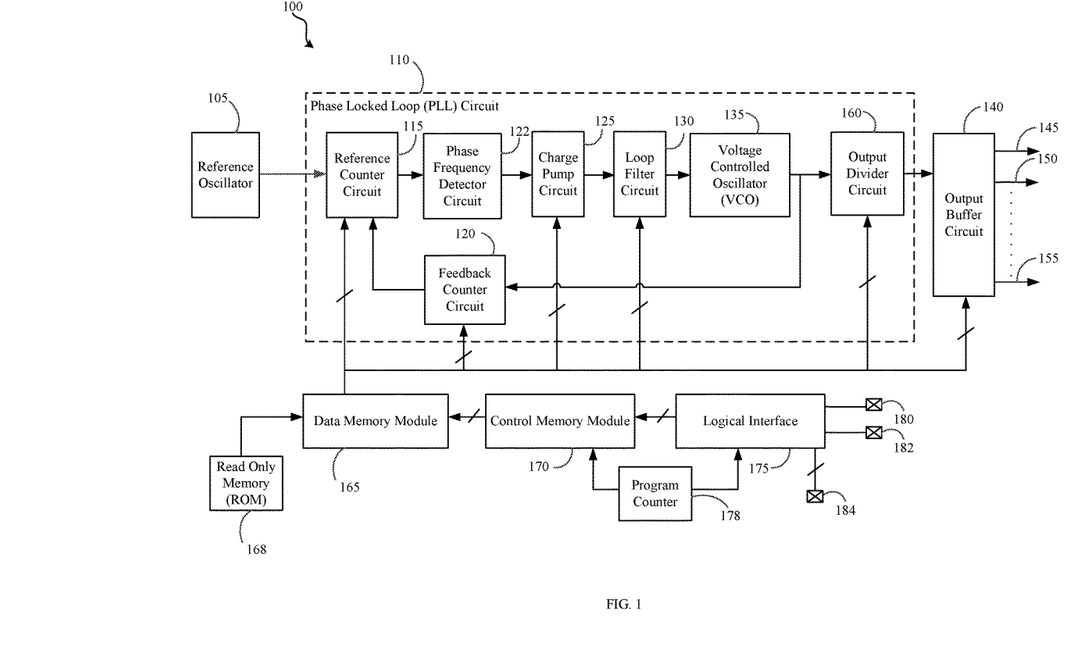
FIG. 1 is a block diagram of illustrating a frequency synthesizer system having microcode control, in accordance with an embodiment of the present invention.

With reference to FIG. 1, the present invention provides a frequency synthesizer system 100 including one or more programmable circuits, a logical interface 175, a data memory module 165 coupled to the logical interface 175 and to the one or more programmable circuits, wherein the data memory module stores a plurality of microcode instructions to control one or more behaviors of the one or more programmable circuits. The frequency synthesizer system 100 further includes, a control memory module 170 coupled to the logical interface 175 and the data memory module 165, the control memory module 170 storing a sequence of addresses for the plurality of microcode instructions stored in the data memory module 165 and a program counter 178 coupled to the control memory module 170 and the logical interface 175, the program counter 178 for stepping through the sequence of addresses stored in the control memory module 170 to execute the plurality of microcode instructions stored in the data memory module 165 for controlling the one or more behaviors of one or more programmable circuits of the frequency synthesizer system 100.

In the embodiment illustrated in FIG. 1, the one or more programmable circuits are circuit elements of a phase locked loop (PLL) circuit 110. In particular, the one more more programmable circuits of the PLL circuit 110 may include, a reference counter circuit 115, a charge pump circuit 125, a loop filter circuit 130, a feedback counter circuit 120 and an output divider circuit 160, and wherein the data memory module 165 is coupled to one or more of the reference counter circuit 115, the loop filter circuit 130, the feedback counter circuit 120 and the output divider circuit 160.

The operation of PLL circuits is well understood in the art as an architecture for generating timing signals. In a basic PLL circuit, a feedback system receives an incoming oscillating signal from a reference oscillator 105 and generates an output waveform that oscillates at an integer or fractional multiple of the input signal. The PLL circuit 110 of FIG. 1 is comprised of a reference counter circuit 115, a phase frequency detector circuit 122, a charge pump circuit 125, a loop filter circuit 130, a voltage controlled oscillator (VCO) 135, an output divider 160 and a feedback counter circuit 120. The output of the PLL 110 is a waveform whose frequency is the frequency of the input waveform frequency from the reference oscillator 105 multiplied by the value of feedback counter circuit 120 and divided by the product of the values of the reference counter circuit 115 and the output divider circuit 160. The feedback counter circuit 120, along with charge pump circuit 125 and the loop filter 130, control the frequency domain behavior of the PLL, the most important of which is providing a stable signal. For this purpose, the value of both charge pump circuit 125, which is current, and the component values of the loop filter circuit 130, which are resisters and capacitors, need to be controlled. As such, the output frequency of the PLL 110 can be changed by modifying the values of the feedback counter circuit 120, the charge pump circuit 125, the loop filter circuit 130 and the output divider circuit 160. The frequency synthesizer system 100 may further include an output buffer circuit 140 coupled to the output of the PLL circuit 110. The output buffer circuit 140 may be used for distribution of the clock signals 145, 150, 155 generated the PLL circuit 110. The values of the output buffer circuit 140 may also be programmed to further control the behavior of the frequency synthesizer system 100.

The frequency synthesizer system 100 further comprises, a read only memory (ROM) 168, a data memory module 165 coupled to the ROM, a control memory module 170 coupled to the data memory module 165, a logical interface 175 coupled to the control memory module 170 and a program counter 178 coupled to the logical interface 175 and the control memory module 170. The logical interface may include several input pins, including a reset pin 180 for initiating a reset of the processor board and the frequency synthesizer system 100, an execution pin 182 for initiating execution of the continuation of the initiation process of the processor board after the frequency synthesizer is operational and a control interface input pin 184 to receive input signals for an I²C or SMB interface from a user of the system.

In accordance with the present invention, the one or more circuits of the frequency synthesizer system 100 are coupled to a data memory module 165 and the values provided by the data memory module 165 are used to control one or more behaviors of the one or more circuits of the frequency synthesizer system 100. Accordingly, the values provided by the data memory module 165 are used to control one more behaviors of the reference counter circuit 115, the charge pump circuit 125, the feedback counter circuit 20, the loop filter circuit 130, the output divider circuit 160 and the output buffer circuit 140.

Upon initiation or start-up of the processor board, the reset pin 180 may be initialized and the data memory module 165 may provide default values from the ROM 168 to the PLL 110 to set the PLL 110 into a default state. The logical interface 175 may then provide a microcode control signal from a user indicating that the frequency synthesizer system 100 is to be initiated in microcode mode. If a signal is not received to place the frequency synthesizer system 100 in microcode mode, the frequency synthesizer system 100 will continue initiating in a default mode using the default values stored in the ROM. After the signal has been received to place the frequency synthesizer in microcode mode, a plurality of microcode instructions may be loaded into the control memory module 170 and a sequence of addresses for the plurality of microcode instructions may be stored in the control memory module 170 using the logical interface 175. The control memory module 170 and the data memory module 165 may then be used to execute the microcode instructions, using the program counter 178 to step through the sequence of addresses, and modify the default values stored in the data memory module 165, thereby controlling one or more behaviors of the one or more programmable circuits of the PLL 110.

The sequence of addresses of the memory locations in the data memory module 165, whose values are to be modified during board initialization, are stored in the control memory module 170. The addresses act as pointers to the data memory module 165 whose values are to be modified during board re-initialization, and are stored in the sequence of the loading of the memory locations. The values stored in the data memory module 165 are in the form of binary code that can directly control the operation of the frequency synthesizer system 100. Each cell entry in the control memory module 165 may describe one particular behavior of the synthesizer as controlled by one particular connection from the data memory module 165 to the circuitry of the PLL circuit 110. The logical interface 175 is the state machine that controls the overall operation of the microcode instruction loading and execution. The logical interface 175 may be a standard interface such as SMB or I²C, or it may be proprietarily defined. The logical interface 175 translates control signals into values to be stored into the data memory module 165 and the control memory module 170.

Figure 2:
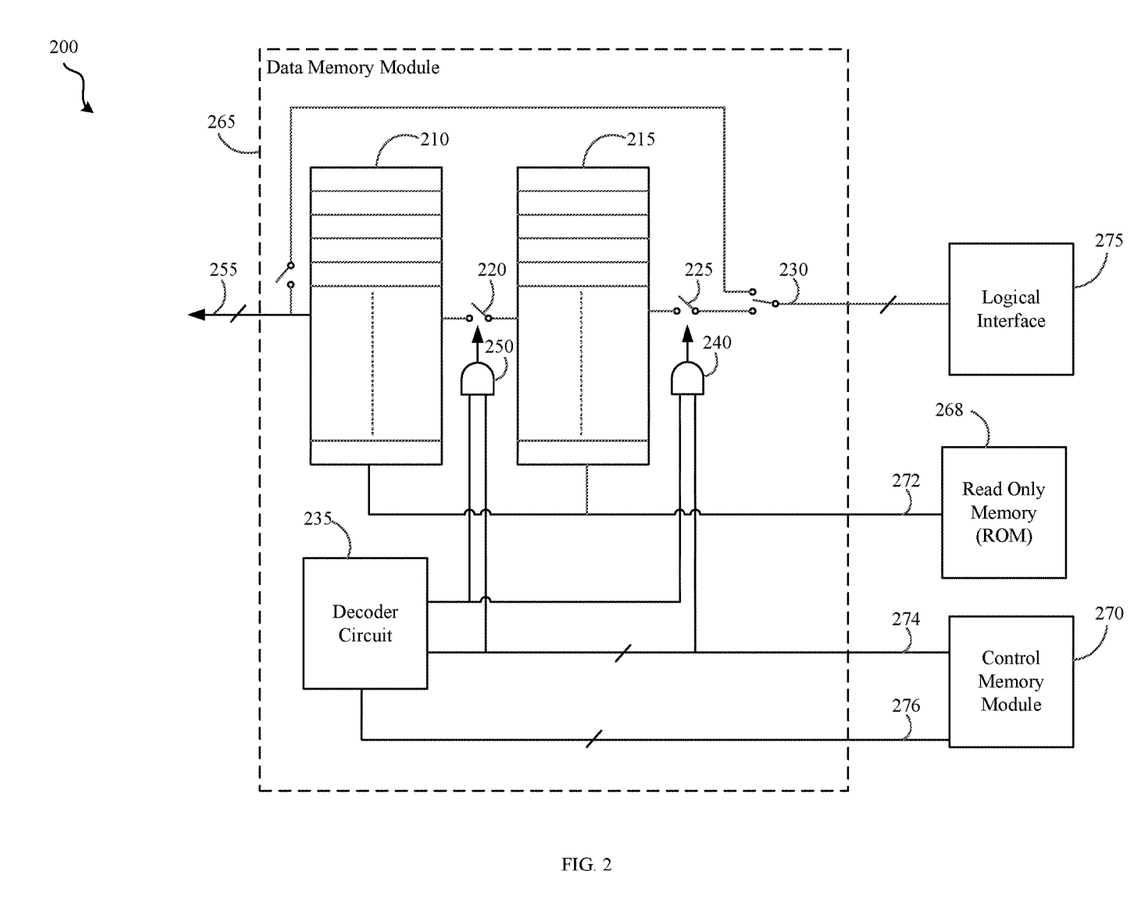
FIG. 2 is a block diagram of the data memory module of the frequency synthesizer system having microcode control, in accordance with an embodiment of the present invention.

With reference to FIG. 2, as previously described, the circuitry 200 for controlling the behavior of the frequency synthesizer system may include, a data memory module 265, a logical interface 275, a ROM 268 and a control memory module 270. In one embodiment, the data memory module 265 may further include a master stage 215 for storing the plurality of microcode instructions to control one or more behaviors of the one or more programmable circuits and a slave stage 210 for storing one or more programmed control values resulting from the execution of the microcode instructions stored in the master stage 215, wherein the programmed control values are used control the one or more behaviors of the one or more programmable circuits. The master stage 215 and the slave stage 210 may be coupled together by a switch 220.

In an exemplary embodiment, the data memory module 265 may comprise several bytes of random access memory (RAM) cells. The RAM cells may be static RAM, dynamic RAM or flip-flops. Each byte of RAM may include of a master stage and a slave stage. Each stage may be formed from several RAM bits. Each bit receives its own value independent of and in parallel with other bits.

The data memory module 265 may further include a switch 230 coupling the logical interface 275 to an input switch 225 of the master stage 215 or to an output 255 of the data memory module 265. The data memory module 265 may further include a ROM 268 to provide the default values to the master stage 215 and the slave stage 210. The data memory module 265 may further include a decoder circuit 235 coupled between the control memory module 270 and circuitry 250 to control the operation of the switch 220 between the master stage 215 and the slave stage 210.

In order to execute the microcode instructions, the frequency synthesizer system is programmed to operate in a microcode mode by disabling a switch 220 between the master stage 215 and the slave stage 210 of a data memory module 265 of the frequency synthesizer system, loading a plurality of microcode instructions into the master stage 215 of the data memory module of the frequency synthesizer system and storing a sequence of addresses for the plurality of microcode instructions in the control memory module 270 of the frequency synthesizer system. When the frequency synthesizer system has been programed in a microcode mode, the decoder circuit 235, in combination with additional logic circuits 240, 250, may operate the switch 225 between the logical interface 275 and the master stage 215 and the switch 220 between the master stage 215 and the slave stage 210, based upon the address sequences stored in the control memory module 270, to receive the microcode instructions from the logical interface 275, to execute the microcode instructions at the master stage 215 and to latch the programmed values into the slave stage 210. The control memory module 270 comprises a specialized data memory block of RAM cells. The programmed values provided by the execution of the microcode instructions in the data memory module 265 may then be provided as output signals 255 to control one or more behaviors of the one or more circuits of the frequency synthesizer system.

In order to execute the microcode instructions at the frequency synthesizer system to control one or more behaviors one or more programmable circuits of the frequency synthesizer system, a program counter may be enabled to step through the sequence of addresses stored in the control memory module 270 to execute each of the plurality of microcode instructions stored in the master stage 215 of the data memory module. Execution of the microcode instructions results in the generation of one or more programmed control values. The one or more programmed control values are then sequentially latched into the slave stage 210 by closing the switch 220 between the master stage and the slave stage 210 of the data memory. The programmed control values 255 stored in the slave stage 210 of the data memory module 265 are then used to control one or more behaviors of one or more programmable circuits of the frequency synthesizer system.

Microcode instructions for controlling the behavior of the frequency synthesizer system are loaded through a switch 230, 225 from the logical interface 275 into the master stage 215 of the data memory module 265, and then loaded into the slave stage 210 through another switch 220. The decoder circuit 235 enables the operation of the byte pointed to by the address of the sequence of addresses stored in the control memory module 270. The control memory module 270 and the decoder circuit 235 control the execution of the microcode instructions at the data memory module 265.

In a particular embodiment, the microcode instructions loaded into the master stage 215 and executed to provide programmed control values at output signals 255 for the frequency synthesizer system may be processor overclocking microcode instructions, resulting in the operation of the frequency synthesizer in an overclocking mode.

The loading and execution of microcode instructions stored at the frequency synthesizer system may be performed during the initiation or power-up of the processor board. If performed during the power-up sequence of the processor board, the frequency synthesizer may be initialized using the microcode, without waiting for the logical interface to become active, thereby eliminating the time delay associated with the programming of the frequency synthesizer system that is common in the prior art. Alternatively, the loading and execution of microcode instructions may be performed at any time during the operation of the frequency synthesizer system.

Figure 3:
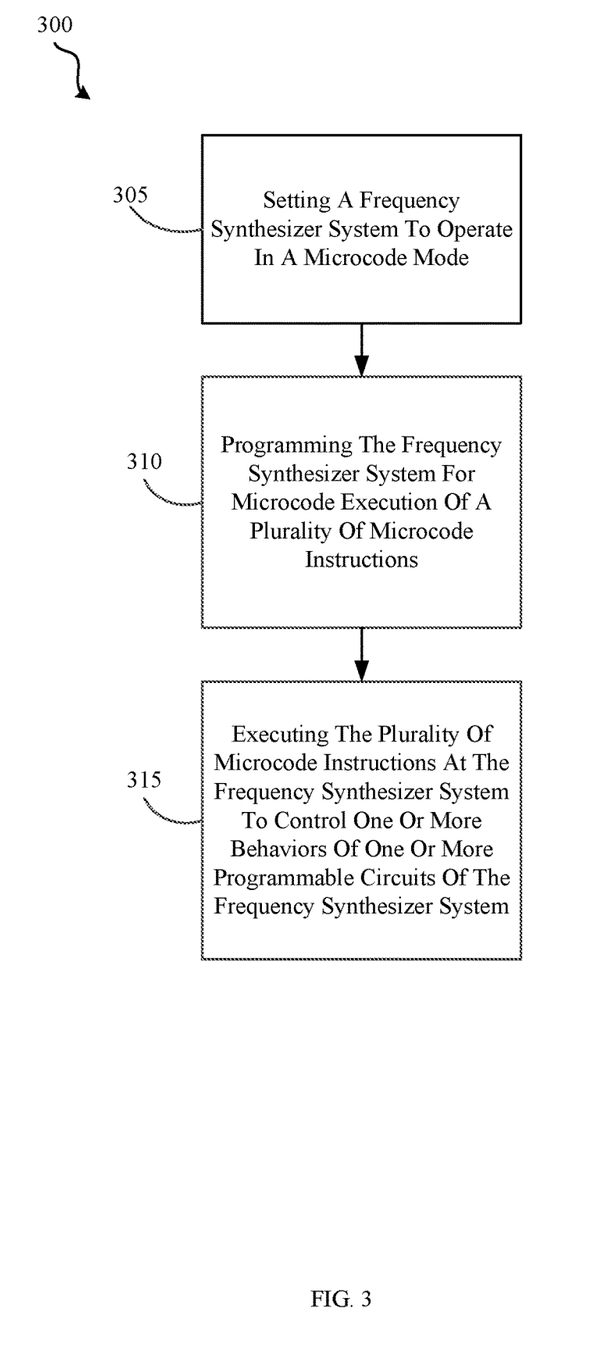
FIG. 3 is a flow diagram illustrating a method for controlling the behavior of a frequency synthesizer system, in accordance with an embodiment of the present invention.

With reference to FIG. 3, in accordance with the present invention, a method 300 for controlling the behavior of a frequency synthesizer system includes, setting a frequency synthesizer system to operate in a microcode mode 305. With reference to FIG. 1, the frequency synthesizer system 100 may be set to operate in a microcode mode by provide a microcode control signal through a logical interface 175 of the frequency synthesizer system. Alternatively, the user may allow the frequency synthesizer system 100 to operate in a default mode.

After the frequency synthesizer system has been set to operate in a microcode mode, the method continues by programming the frequency synthesizer system for microcode execution of a plurality of microcode instructions 310. With reference to FIG. 2, the frequency synthesizer system 200 may be programmed for microcode execution by disabling a switch 220 between a master stage 215 and a slave stage 210 of a data memory module 265 of the frequency synthesizer system 200, loading a plurality of microcode instructions into the master stage 215 of the data memory module 265 of the frequency synthesizer system 200 and storing a sequence of addresses for the plurality of microcode instructions in a control memory module 270 of the frequency synthesizer system 200.

After programming the frequency synthesizer system for microcode execution of a plurality of microcode instructions, the method continues by executing the plurality of microcode instructions at the frequency synthesizer system to control one or more behaviors of one or more programmable circuits of the frequency synthesizer system 315. With reference to FIG. 2, executing the plurality of microcode instructions at the frequency synthesizer system to control one or more behaviors of one or more programmable circuits of the frequency synthesizer system may include, enabling a program counter for the sequence of addresses stored in the control memory module 270, executing each of the plurality of microcode instructions stored in the master stage 215 of the data memory module 265, using the program counter to step through the sequence of addresses stored in the control memory module 270, to generate one or more programmed control values, closing the switch 220 between the master stage 215 and the slave stage 210 of the data memory module 265 to store the one or more programmed control values in the slave stage 210 of the data memory module and controlling one or more behaviors of one or more programmable circuits of the frequency synthesizer system 200 using the one or more programmed control values in the slave stage 210 of the data memory module 265.

Figure 4:
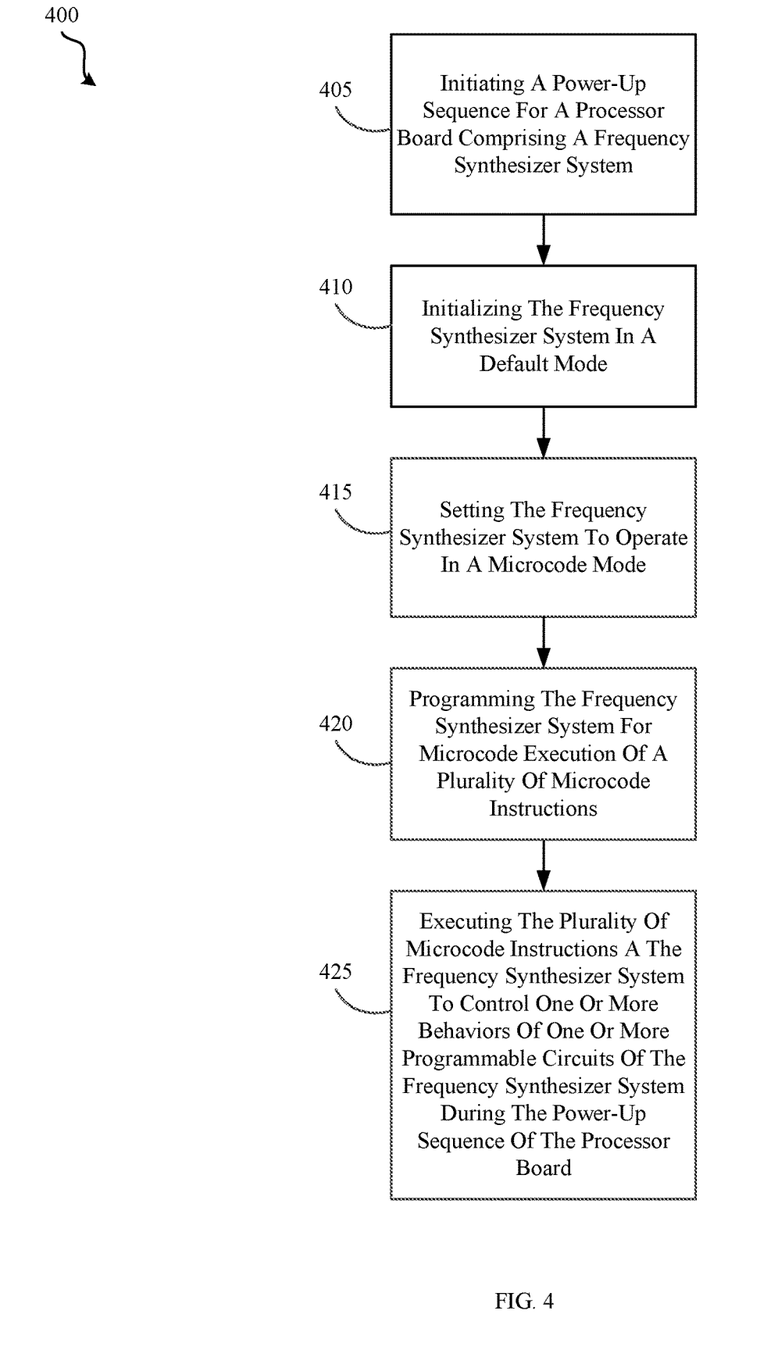
FIG. 4 is a flow diagram illustrating a method for controlling the behavior of a frequency synthesizer during the start-up sequence of a processor board comprising the frequency synthesizer system, in accordance with an embodiment of the present invention.

With reference to FIG. 4, in a particular embodiment, a method 400 for controlling the behavior of a frequency synthesizer system during the initialization of the processor board and the frequency synthesizer system is provided, which includes, initiating a power-up sequence for a processor board comprising a frequency synthesizer system 405. With reference to FIG. 1, a power-up sequence for a processor board comprising a frequency synthesizer system may be initiated by receiving a reset signal 180 through a logical interface 175 of the frequency synthesizer system 100.

Following the initiation of the power-up sequence, the method continues by initializing the frequency synthesizer system in a default mode 410. With reference to FIG. 2, the frequency synthesizer system may be initialized in a default mode by loading one or more default control values into a master stage 215 of a data memory module 265 of the frequency synthesizer system, loading the one or more default control values from the master stage 215 to a slave 210 stage of the data memory module 265 controlling one or more behaviors of one or more programmable circuits of the frequency synthesizer system using the one or more default control values in the slave stage 210 of the data memory module 265.

After the frequency synthesizer system has been initialized in a default mode, the method continues by setting the frequency synthesizer system to operate in a microcode mode 415. With reference to FIG. 1, the frequency synthesizer system 100 may be set to operate in a microcode mode by provide a microcode control signal through a logical interface 175 of the frequency synthesizer system. Alternatively, the user may allow the frequency synthesizer system 100 to operate in a default mode.

After the frequency synthesizer system has been set to operate in a microcode mode, the method continues by programming the frequency synthesizer system for microcode execution of a plurality of microcode instructions 420. With reference to FIG. 2, the frequency synthesizer system 200 may be programmed for microcode execution by disabling a switch 220 between a master stage 215 and a slave stage 210 of a data memory module 265 of the frequency synthesizer system 200, loading a plurality of microcode instructions into the master stage 215 of the data memory module 265 of the frequency synthesizer system 200 and storing a sequence of addresses for the plurality of microcode instructions in a control memory module 270 of the frequency synthesizer system 200.

After programming the frequency synthesizer system for microcode execution of a plurality of microcode instructions, the method continues by executing the plurality of microcode instructions at the frequency synthesizer system to control one or more behaviors of one or more programmable circuits of the frequency synthesizer system during the power-up sequence of the processor board 310. With reference to FIG. 2, executing the plurality of microcode instructions at the frequency synthesizer system to control one or more behaviors of one or more programmable circuits of the frequency synthesizer system may include, enabling a program counter for the sequence of addresses stored in the control memory module 270, executing each of the plurality of microcode instructions stored in the master stage 215 of the data memory module 265, using the program counter to step through the sequence of addresses stored in the control memory module 270, to generate one or more programmed control values, closing the switch 220 between the master stage 215 and the slave stage 210 of the data memory module 265 to store the one or more programmed control values in the slave stage 210 of the data memory module and controlling one or more behaviors of one or more programmable circuits of the frequency synthesizer system 200 during the power-up sequence of the processor board using the one or more programmed control values in the slave stage 210 of the data memory module 265.

Frequency synthesizer system 100 is shown to include nonvolatile memory in the form of ROM 168. However, other types of nonvolatile memory could also be used such as, for example, one-time programmable nonvolatile memory (OTPNVM).

In one embodiment, the frequency synthesizer system 100 is implemented in an integrated circuit as a single semiconductor die. Alternatively, the integrated circuit may include multiple semiconductor die that are electrically coupled together such as, for example, a multi-chip module that is packaged in a single integrated circuit package. In one embodiment PLL circuit 110, output buffer circuit 140, logical interface 175, program counter 178, control memory module 170 and data memory module 165 are formed on a single semiconductor die that is coupled to a ROM 168 that is formed on a separate semiconductor die. Alternatively, PLL circuit 110, output buffer circuit 140, logical interface 175, program counter 178, control memory module 170 and data memory module 165 and ROM 168 are formed on a single semiconductor die.

In various embodiments, the system of the present invention may be implemented in a Field Programmable Gate Array (FPGA) or Application Specific Integrated Circuit (ASIC). As would be appreciated by one skilled in the art, various functions of circuit elements may also be implemented as processing steps in a software program. Such software may be employed in, for example, a digital signal processor, microcontroller or general-purpose computer.

The present invention provides a system and method that allows one or more programmable circuits of a frequency synthesizer system to be programmed using a plurality of microcode instructions.

We claim:

1. A method for controlling a frequency synthesizer system, the method comprising:
   setting the frequency synthesizer system to operate in a microcode mode, the frequency synthesizer system including a data memory circuit having a master stage, a slave stage and a switch that extends between the master stage and the slave stage;
   programming the frequency synthesizer system for microcode execution of a plurality of microcode instructions by disabling the switch, loading a plurality of microcode instructions into the master stage of the data memory circuit and storing a sequence of addresses for the plurality of microcode instructions in a memory of the frequency synthesizer system; and
   executing the plurality of microcode instructions at the frequency synthesizer system to control one or more behaviors of one or more programmable circuits of the frequency synthesizer system.

2. The method of claim 1, wherein the one or more programmable circuits comprises a phase locked loop (PLL) circuit and wherein executing the microcode instructions at the frequency synthesizer system to control one or more behaviors of one or more programmable circuits of the frequency synthesizer system further comprises executing microcode at the frequency synthesizer system to control one or more behaviors of the PLL circuit.

3. The method of claim 1, wherein the one or more programmable circuits comprises an output buffer circuit and wherein executing microcode at the frequency synthesizer system to control one or more behaviors of one or more programmable circuits of the frequency synthesizer system further comprises executing microcode at the frequency synthesizer system to control one or more behaviors of the output buffer circuit.

4. The method of claim 1, wherein setting the frequency synthesizer system to operate in microcode mode further comprises, providing a microcode control signal through a logical interface of the frequency synthesizer system.

5. The method of claim 1, wherein executing the microcode at the frequency synthesizer system to control one or more behaviors of one or more programmable circuits of the frequency synthesizer system further comprises:
   enabling a program counter for the sequence of addresses stored in the memory;
   executing each of the plurality of microcode instructions stored in the master stage of the data memory circuit, using the program counter to step through the sequence of addresses stored in the memory, to generate one or more programmed control values;
   closing the switch to store the one or more programmed control values in the slave stage of the data memory circuit; and
   controlling one or more behaviors of one or more programmable circuits of the frequency synthesizer system using the one or more programmed control values in the slave stage of the data memory circuit.

6. The method of claim 1, wherein the one or more programmable circuits of the frequency synthesizer system are selected from a phase locked loop (PLL) circuit and an output buffer circuit.

7. The method of claim 1, wherein the microcode instructions are processor overclocking microcode instructions.

8. The method of claim 1, wherein loading a plurality of microcode instructions into the master stage of the data memory circuit further comprises, writing the plurality of microcode instructions into the master stage of the data memory circuit through a logical interface of the frequency synthesizer system.

9. A method for controlling a frequency synthesizer system, the method comprising:
   initiating a power-up sequence for a processor board comprising the frequency synthesizer system, the frequency synthesizer system including a data memory circuit having a master stage, a slave stage and a switch that extends between the master stage and the slave stage;
   initializing the frequency synthesizer system in a default mode after the initiating a power-up sequence for the processor board by loading one or more default control values into the master stage of the data memory circuit, loading the one or more default control values from the master stage to the slave stage of the data memory circuit through the switch, and controlling one or more behaviors of one or more programmable circuits of the frequency synthesizer system using the one or more default control values in the slave stage of the data memory circuit;
   setting the frequency synthesizer system to operate in a microcode mode after the initiating a power-up sequence;
   programming the frequency synthesizer system for microcode execution of a plurality of microcode instructions; and executing the plurality of microcode instructions at the frequency synthesizer system to control the one or more behaviors of the one or more programmable circuits of the frequency synthesizer system.

10. The method of claim 9, wherein loading one or more default control values into the master stage of the data memory circuit of the frequency synthesizer system further comprises, loading one or more default control values from a Read Only Memory (ROM) circuit into the master stage of the data memory circuit of the frequency synthesizer system.

11. A frequency synthesizer system comprising:
   a phase locked loop (PLL) circuit including a reference counter circuit, a charge pump circuit, a loop filter circuit, a feedback counter circuit and an output divider circuit;
   a logical interface;
   a data memory circuit having a master stage, a slave stage and a switch that extends between the master stage and the slave stage, the data memory circuit coupled to the logical interface and coupled to one or more of the reference counter circuit, the loop filter circuit, the feedback counter circuit and the output divider circuit, the data memory circuit for storing a plurality of microcode instructions to control one or more behaviors of the PLL circuit;
   a control memory circuit coupled to the logical interface and the data memory circuit, the control memory circuit storing a sequence of addresses for the plurality of microcode instructions stored in the data memory circuit; and
   a program counter coupled to the control memory circuit and the logical interface, the program counter for stepping through the sequence of addresses stored in the control memory circuit to execute the plurality of microcode instructions stored in the data memory circuit for controlling the one or more behaviors of the PLL circuit.

12. A frequency synthesizer system comprising:
   one or more programmable circuits;
   a logical interface;
   a data memory circuit coupled to the logical interface and to the one or more programmable circuits, the data memory circuit including a master stage for storing a plurality of microcode instructions to control one or more behaviors of the one or more programmable circuits, a slave stage for storing one or more programmed control values resulting from the execution of the microcode instructions stored in the master stage, the programmed control values to control the one or more behaviors of the one or more programmable circuits, and a switch coupled between the master stage and the slave stage;
   a control memory circuit coupled to the logical interface and the data memory circuit, the control memory circuit storing a sequence of addresses for the plurality of microcode instructions; and
   a program counter coupled to the control memory circuit and the logical interface, the program counter for stepping through the sequence of addresses to execute the plurality of microcode instructions.

13. The frequency synthesizer system of claim 12, wherein the microcode instructions are processor overclocking microcode instructions.

* * * * *